United States Patent
Chan et al.

(10) Patent No.: US 10,873,359 B1
(45) Date of Patent: Dec. 22, 2020

(54) WIRELESS TRANSCEIVER DEVICE

(71) Applicant: REALTEK SEMICONDUCTOR CORP., Hsinchu (TW)

(72) Inventors: Ka-Un Chan, Hsinchu (TW); Kuan-Yu Shih, Hsinchu (TW); Chia-Yi Lee, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/732,702

(22) Filed: Jan. 2, 2020

(30) Foreign Application Priority Data

Aug. 16, 2019 (TW) .............................. 108129370 A

(51) Int. Cl.
*H04B 1/44* (2006.01)
*H04B 1/40* (2015.01)
*H04W 88/02* (2009.01)

(52) U.S. Cl.
CPC .............. *H04B 1/40* (2013.01); *H04W 88/02* (2013.01)

(58) Field of Classification Search
CPC .......... H04B 1/0458; H04B 1/16; H04B 1/40; H04B 17/20; H04B 1/005
See application file for complete search history.

(56) References Cited

U.S. PATENT DOCUMENTS

| 6,112,060 | A | * | 8/2000 | Lim | ........................ | H04B 1/40 455/129 |
| 2008/0049817 | A1 | * | 2/2008 | Der | ...................... | H03M 3/398 375/219 |
| 2014/0120852 | A1 | * | 5/2014 | Ashizuka | ............. | H04B 1/0458 455/127.1 |
| 2018/0226932 | A1 | | 8/2018 | Beaudin et al. | | |
| 2019/0379421 | A1 | * | 12/2019 | Niakan | ................ | H04B 17/336 |

FOREIGN PATENT DOCUMENTS

| CN | 101159441 B | 1/2011 |
| CN | 102201798 A | 9/2011 |
| CN | 105993128 B | 1/2019 |

\* cited by examiner

*Primary Examiner* — Nhan T Le
(74) *Attorney, Agent, or Firm* — Birch, Stewart, Kolasch & Birch LLP

(57) ABSTRACT

A wireless transceiver device includes an antenna unit for receiving a first RF signal or transmitting a second RF signal. A first matching unit is connected to the antenna unit and a receiving circuit. The first matching unit and the receiving circuit form a first signal receiving channel for receiving the first RF signal when the first RF signal is a high/low gain RF signal. A second matching unit is connected to the antenna unit and a transmitting circuit. The second matching unit and the transmitting circuit form a signal transmitting channel for transmitting the second RF signal. A bypass coupling circuit is connected to the receiving circuit and the second matching unit. The second matching unit, the bypass coupling circuit, and the receiving circuit form a second signal receiving channel for receiving the first RF signal when the first RF signal is a middle gain RF signal.

11 Claims, 7 Drawing Sheets

10,873,359 B1

WIRELESS TRANSCEIVER DEVICE

CROSS-REFERENCE TO RELATED APPLICATION

This non-provisional application claims priority under 35 U.S.C. § 119(a) to Patent Application No. 108129370 in Taiwan, R.O.C. on Aug. 16, 2019, the entire contents of which are hereby incorporated by reference.

BACKGROUND

Technical Field

The present invention relates to a radio frequency (RF) front end technology, and in particular, to a wireless transceiver device with desirable linearity.

Related Art

An existing RF transceiver circuit mainly includes a transmitting circuit (TX) and a receiving circuit (RX). The two circuits are usually designed separately and are combined with an antenna through an appropriate matching unit, to transmit or receive wireless RF signals.

To achieve a wide receiving power range, there are a plurality of options to attenuate or enhance signal power in the receiving circuit. However, when different gain settings are designed, linearity may be limited by an off-state switching element connected in parallel to a signal path. When a strong power signal is received, the off-state switching element may be affected by a large signal swing, resulting in reduced linearity of the receiving circuit. This case is especially likely to occur in the case of a middle-gain signal.

SUMMARY

In view of this, the present invention proposes a wireless transceiver device, including an antenna unit, a first matching unit, a receiving circuit, a second matching unit, a transmitting circuit, and a bypass coupling circuit. The antenna unit may receive a first RF signal or transmit a second RF signal. The first matching unit is electrically connected to the antenna unit and the receiving circuit. The first matching unit and the receiving circuit form a first signal receiving channel for receiving the first RF signal when the first RF signal is a high/low gain RF signal. The second matching unit is electrically connected to the antenna unit and the transmitting circuit. The second matching unit and the transmitting circuit form a signal transmitting channel for transmitting the second RF signal. The bypass coupling circuit is electrically connected to the receiving circuit and the second matching unit. The second matching unit, the bypass coupling circuit, and the receiving circuit form a second signal receiving channel for receiving the first RF signal when the first RF signal is a middle gain RF signal.

The present invention further proposes another wireless transceiver device, including an antenna unit, a first matching unit, a receiving circuit, a second matching unit, a transmitting circuit, a third matching unit, and a bypass coupling circuit. The antenna unit may receive a first RF signal or transmit a second RF signal. The first matching unit is electrically connected to the antenna unit and the receiving circuit. The first matching unit and the receiving circuit form a first signal receiving channel for receiving the first RF signal when the first RF signal is a high/low gain RF signal. The second matching unit is electrically connected to the antenna unit and the transmitting circuit. The second matching unit and the transmitting circuit form a signal transmitting channel for transmitting the second RF signal. The third matching unit is electrically connected to the antenna unit and the bypass coupling circuit. The bypass coupling circuit is electrically connected to the receiving circuit. The third matching unit, the bypass coupling circuit, and the receiving circuit form a second signal receiving channel for receiving the first RF signal when the first RF signal is a middle gain RF signal.

According to some embodiments, the bypass coupling circuit is a capacitive voltage dividing coupling circuit, a resistive voltage dividing coupling circuit or an active element coupling circuit.

In conclusion, to overcome limitations of linearity, the wireless transceiver device proposed by the present invention may receive the middle gain RF signal through the bypass coupling circuit with the matching units in a signal receiving mode, to improve linearity of the receiving circuit and make a circuit design of a wireless transceiver circuit more flexible.

DETAILED DESCRIPTION

Figure 1:
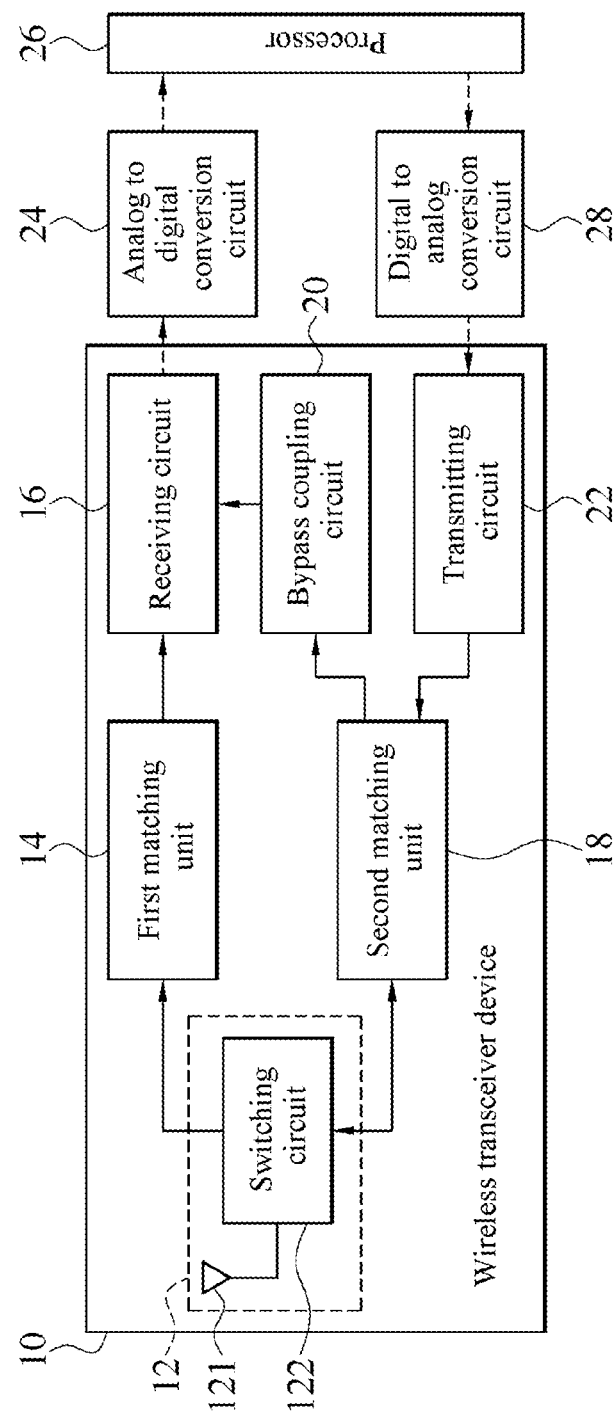
FIG. 1 is a schematic block diagram of a wireless transceiver device according to an embodiment of the present invention.

FIG. 1 is a schematic block diagram of a wireless transceiver device according to an embodiment of the present invention. Referring to FIG. 1, a wireless transceiver device 10 includes an antenna unit 12, a first matching unit 14, a receiving circuit 16, a second matching unit 18, a bypass coupling circuit 20, and a transmitting circuit 22. The antenna unit 12 is configured to receive a first RF signal or transmit a second RF signal. The antenna unit 12 further includes an antenna 121 and a switching circuit 122. The antenna 121 is electrically connected to the switching circuit 122, to switch between a signal transmitting mode and a signal receiving mode through the switching circuit 122. The first matching unit 14 is electrically connected to the antenna unit 12 and the receiving circuit 16. The receiving circuit 16 is further electrically connected to an analog to digital conversion circuit 24 at a back end. The analog to digital conversion circuit 24 is further electrically connected to a processor 26. When the wireless transceiver device 10 is in the signal receiving mode, the antenna unit 12 receives the first RF signal and transmits the first RF signal to the receiving circuit 16 through the first matching unit 14. The receiving circuit 16 then transmits the first RF signal being an analog signal to the analog to digital conversion circuit 24. The analog to digital conversion circuit 24 converts the first RF signal into a digital signal. The digital signal is then transmitted to the processor 26 for processing. The second matching unit 18 is electrically connected to the antenna unit 12 and the transmitting circuit 22. The transmitting circuit 22 is further electrically connected to a digital to analog conversion circuit 28 at the back end. The digital to analog conversion circuit 28 is then electrically connected to the processor 26. When the wireless transceiver device 10 is in the signal transmitting mode, the processor 26 transmits a to-be-transmitted digital signal to the digital to analog conversion circuit 28. The digital to analog conversion circuit 28 converts the digital signal into an analog signal and transmits the analog signal to the transmitting circuit 22. The transmitting circuit 22 generates the second RF signal based on the analog signal. The second RF signal then sequentially passes through the second matching unit 18 and the antenna unit 12 to be transmitted.

The first matching unit 14 and the receiving circuit 16 form a first signal receiving channel for receiving the first RF signal when the first RF signal is a high/low gain RF signal. The second matching unit 18 and the transmitting circuit 22 form a signal transmitting channel for transmitting the second RF signal. To overcome limitations of linearity, the bypass coupling circuit 20 is added in the present invention. The bypass coupling circuit 20 is electrically connected to the receiving circuit 16 and the second matching unit 18. The bypass coupling circuit 20 and the transmitting circuit 22 share the second matching unit 18. In this way, the second matching unit 18, the bypass coupling circuit 20, and the receiving circuit 16 form a second signal receiving channel for receiving the first RF signal when the first RF signal is a middle gain RF signal. Because there is no switching element on a path (the second signal receiving channel) for transmitting the middle gain RF signal, there is no impact from the off-state switching element, thereby improving linearity of the receiving circuit 16.

In an embodiment, the antenna unit 12 receives the first RF signal. The first RF signal may be determined as a high gain RF signal, a middle gain RF signal or a low gain RF signal based on a gain required by the signal. When a value of the required gain is greater than −30 dBm, the first RF signal is a high gain RF signal. When a value of the required gain is between −50 dBm and −30 dBm, the first RF signal is a middle gain RF signal. When a value of the required gain is less than −50 dBm, the first RF signal is a low gain RF signal. The "high/low gain RF signal" means that the signal is a high gain RF signal or a low gain RF signal. However, the foregoing values are merely examples, and the present invention is not limited thereto. Provided that values are used to obtain at least a high range, a middle range, and a low range, the values shall fall within the protection scope of the present invention.

Figure 2:
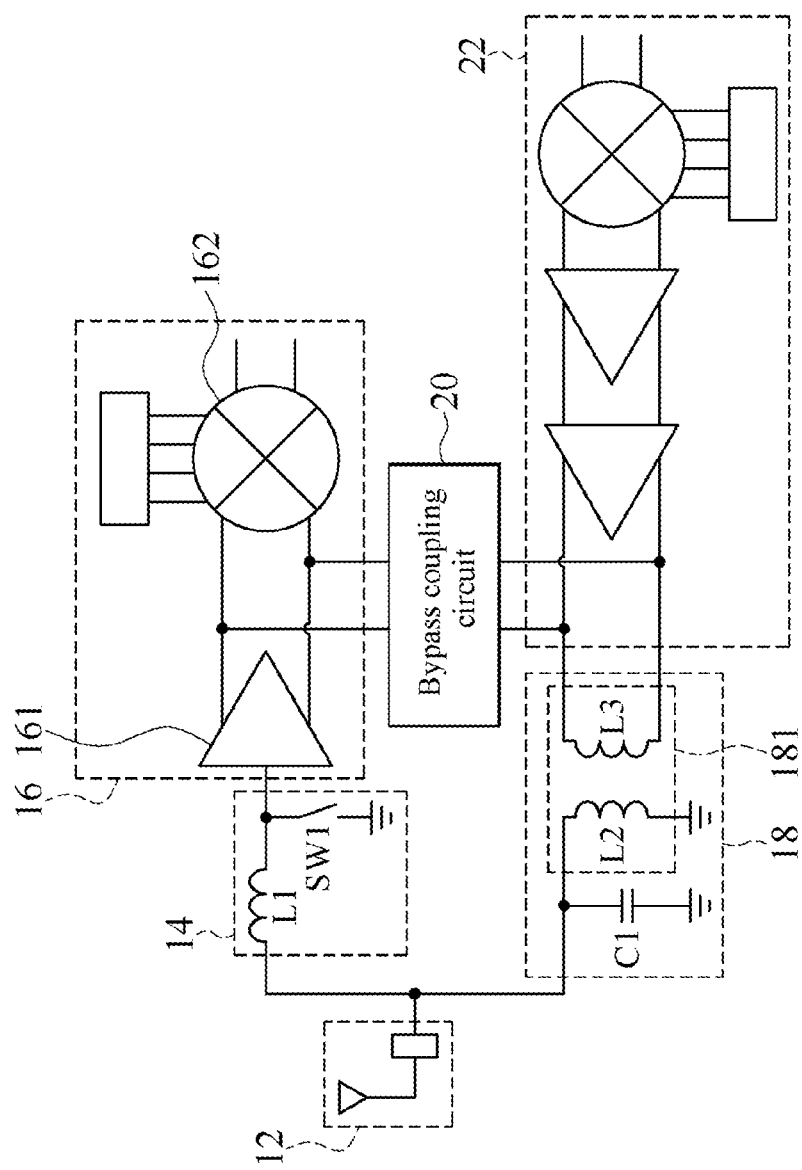
FIG. 2 is a schematic circuit diagram of a wireless transceiver device according to an embodiment of the present invention.

FIG. 2 is a schematic circuit diagram of a wireless transceiver device according to an embodiment of the present invention. In an embodiment, referring to both FIG. 1 and FIG. 2, in the wireless transceiver device 10, the receiving circuit 16 at least includes a low noise amplifier (LNA) 161 and a mixer 162. The LNA 161 is electrically connected to the first matching unit 14. The high/low gain RF signal is matched by the first matching unit 14 before entering the LNA 161. The LNA 161 performs signal attenuation or amplification on the high/low gain RF signal. The mixer 162 is electrically connected to the LNA 161 and a back end circuit (the analog to digital conversion circuit 24), so that the mixer 162 receives the high/low gain RF signal, down-converts the high/low gain RF signal, and transmits the down-converted high/low gain RF signal to a back end for signal processing. According to another aspect, the bypass coupling circuit 20 is also electrically connected to the mixer 162, so that the mixer 162 is configured to receive the middle gain RF signal from the bypass coupling circuit 20, down-convert the middle gain RF signal, and transmit the down-converted middle gain RF signal to the back end for signal processing.

In an embodiment, the first matching unit 14 includes a first inductor L1 and a switching element SW1. The first inductor L1 is electrically connected to the antenna unit 14 and the LNA 161. One end of the switching element SW1 is electrically connected between the first inductor L1 and the LNA 161, and the other end of the switching element SW1 is electrically connected to a ground terminal. When the wireless transceiver device 10 is in the signal receiving mode, when the switching element SW1 is in a non-conducting state (an open circuit), the high/low gain RF signal is transmitted through the first signal receiving channel that is formed by the first inductor L1, the LNA 161, and the mixer 162. When the switching element SW1 is in a conducting state (a short circuit), the LNA 161 is in an off state, and the middle gain RF signal is transmitted through the second signal receiving channel that is formed by the second matching unit 18, the bypass coupling circuit 20, and the mixer 162. When the wireless transceiver device 10 is in the signal transmitting mode, because the second RF signal has high power, to prevent the second RF signal with high power from affecting the LNA 161 of the receiving circuit 16, in this case, the switching element SW1 is in a conducting state to conduct excess power to the ground terminal, thereby protecting the LNA 161 of the receiving circuit 16.

In an embodiment, the second matching unit 18 includes at least one passive element and an inductor pair 181. The passive element herein is, for example, but is not limited to, a capacitor C1. The capacitor C1 is electrically connected to the antenna unit 12 and the ground terminal. The inductor pair 181 includes a second inductor L2 and a third inductor L3. The second inductor L2 is connected in parallel to the capacitor C1. The third inductor L3 is electrically connected to the transmitting circuit 22. The third inductor L3 is also electrically connected to the bypass coupling circuit 20. The inductor pair 181 is configured to convert a single-ended signal into a differential signal or convert a differential signal into a single-ended signal.

Referring to FIG. 1 and FIG. 2, when the wireless transceiver device 10 is in the signal receiving mode, when the first RF signal is a high/low gain RF signal and the processor 26 controls the switching element SW1 to stay in a non-conducting state, the high/low gain RF signal is received and transmitted through the first signal receiving channel that is formed by the first inductor L1, the LNA 161, and the mixer 162. When the first RF signal is a middle gain RF signal, the processor 26 controls the switching element SW1 to switch from a non-conducting state to a conducting state, and the processor 26 controls the LNA 161 to be in an off state, in this case, in the signal receiving mode, the bypass coupling circuit 20 receives and transmits the middle gain RF signal through the second matching unit 18, that is, the second signal receiving channel that is formed by the capacitor C1, the second inductor L2, the third inductor L3, the bypass coupling circuit 20, and the mixer 162. In addition, when the wireless transceiver device 10 is in the signal transmitting mode, the processor 26 controls the switching element SW1 to be in a conducting state. In this case, the second RF signal is transmitted through the transmitting circuit 22 and the signal transmitting channel that is formed by the third inductor L3, the second inductor L2, and the capacitor C1, and is transmitted through the antenna unit 12. In an embodiment, a circuit structure of the transmitting circuit 22 is not a focus of the present invention, and therefore details of the circuit structure of the transmitting circuit 22 are not described herein.

Figure 3:
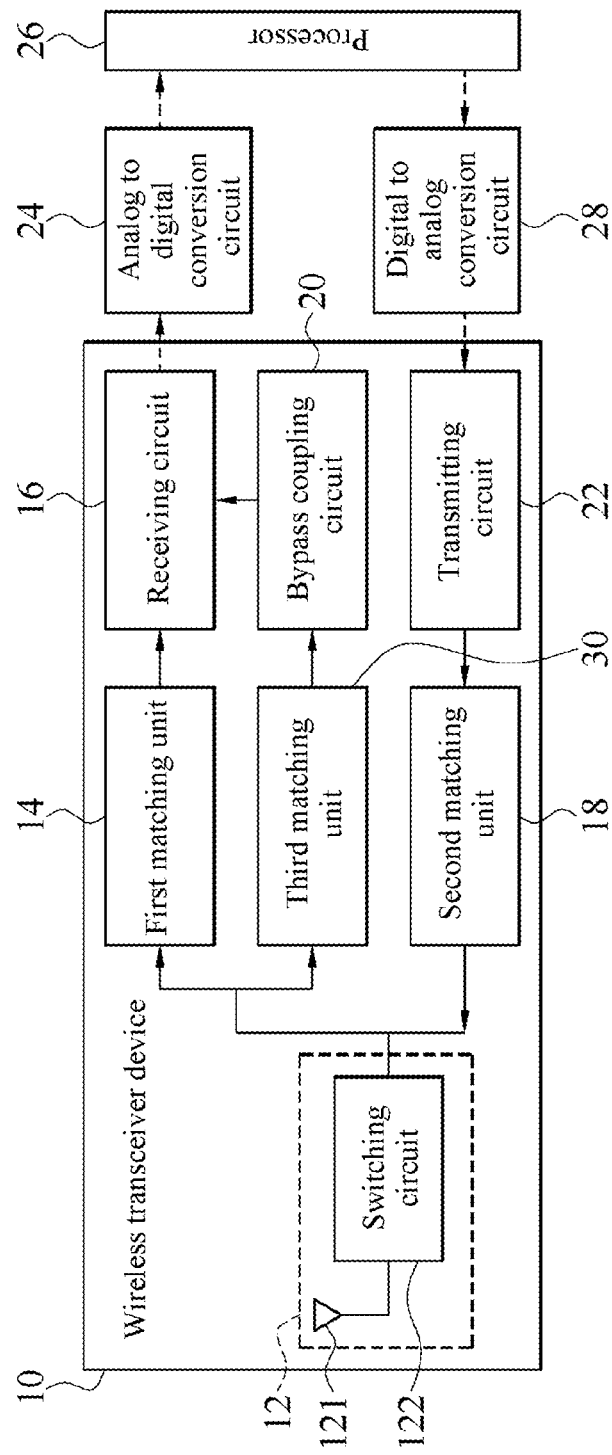
FIG. 3 is a schematic block diagram of a wireless transceiver device according to another embodiment of the present invention.

FIG. 3 is a schematic block diagram of a wireless transceiver device according to another embodiment of the present invention. Referring to FIG. 3, a wireless transceiver device 10 includes an antenna unit 12, a first matching unit 14, a receiving circuit 16, a second matching unit 18, a transmitting circuit 22, a third matching unit 30, and a bypass coupling circuit 20.

The antenna unit 12 selectively receives a first RF signal or transmits a second RF signal. The first matching unit 14 is electrically connected to the antenna unit 12 and the receiving circuit 16. The first matching unit 14 and the receiving circuit 16 form a first signal receiving channel for receiving the first RF signal when the first RF signal is a high/low gain RF signal. The second matching unit 18 is electrically connected to the antenna unit 12 and the transmitting circuit 22. The second matching unit 18 and the transmitting circuit 22 form a signal transmitting channel for transmitting the second RF signal. The third matching unit 30 is electrically connected to the antenna unit 12 and the bypass coupling circuit 20. The bypass coupling circuit 20 is electrically connected to the receiving circuit 16. The third matching unit 30, the bypass coupling circuit 20, and the receiving circuit 16 form a second signal receiving channel for receiving the first RF signal when the first RF signal is a middle gain RF signal.

Figure 4:
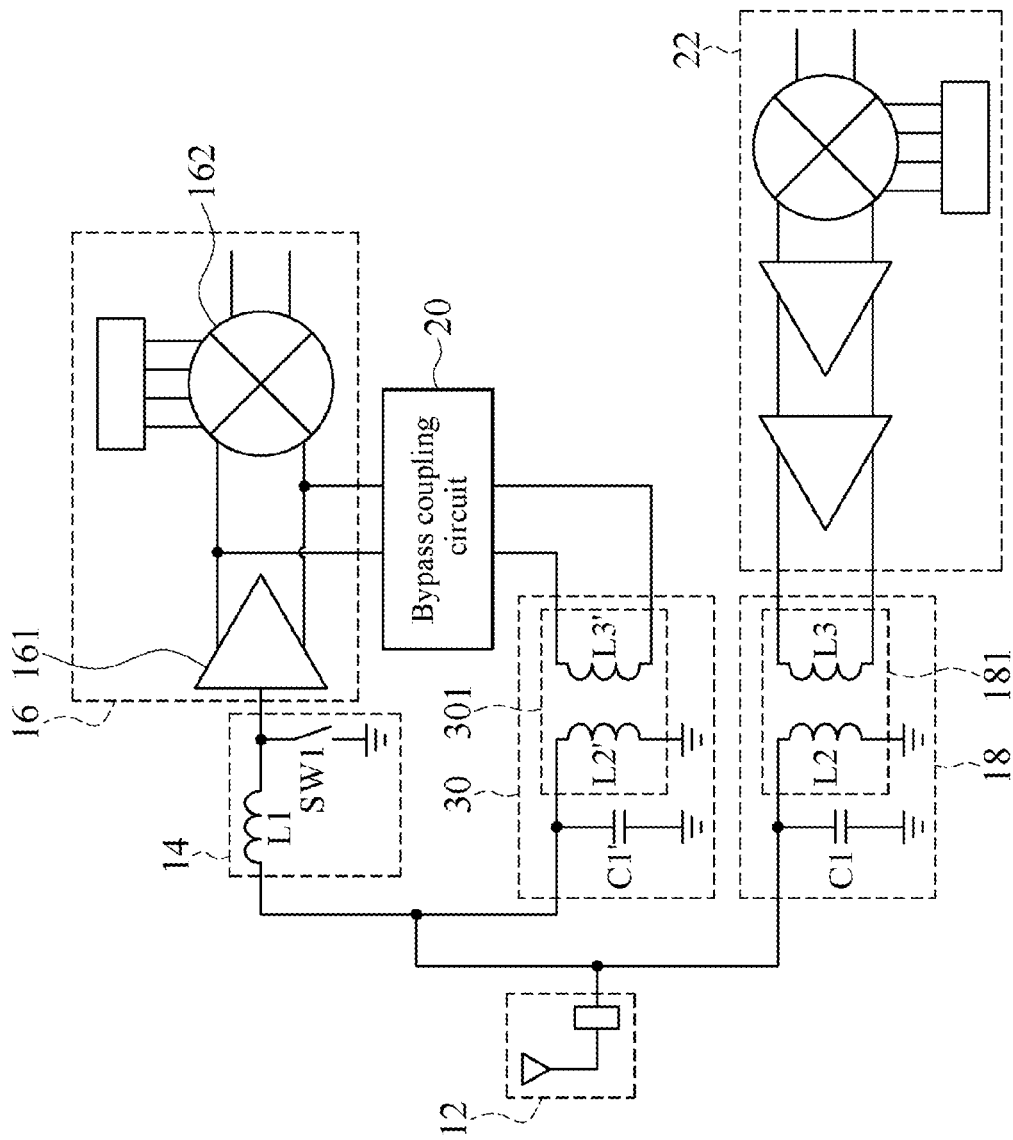
FIG. 4 is a schematic circuit diagram of a wireless transceiver device according to another embodiment of the present invention.

In an embodiment, referring to both FIG. 3 and FIG. 4, detailed circuits of the first matching unit 14, the receiving circuit 16, and the second matching unit 18 are the same as those in the foregoing embodiments, and are therefore not described herein again. In this embodiment, the bypass coupling circuit 20 does not use the second matching unit 18, but instead uses only the third matching unit 30. The third matching unit 30 and the second matching unit 18 may have the same circuit structure or different circuit structures. Herein, for example, the third matching unit 30 and the second matching unit 18 have the same circuit structure. Therefore, the third matching unit 30 includes at least one passive element and an inductor pair 301. The passive element herein is, for example, but is not limited to, a capacitor C1'. The capacitor C1' is electrically connected to the antenna unit 12 and a ground terminal. The inductor pair 301 includes a second inductor L2' and a third inductor L3'. The second inductor L2' is connected in parallel to the capacitor C1'. The third inductor L3' is electrically connected to the bypass coupling circuit 20.

Referring to FIG. 3 and FIG. 4, when the wireless transceiver device 10 is in the signal receiving mode, when the first RF signal is a high/low gain RF signal and the processor 26 controls the switching element SW1 to stay in a non-conducting state, the high/low gain RF signal is received and transmitted through the first signal receiving channel that is formed by the first inductor L1, the LNA 161, and the mixer 162. When the first RF signal is a middle gain RF signal, the processor 26 controls the switching element SW1 to switch from a non-conducting state to a conducting state, and the process 26 controls the LNA 161 to be in an off state, in this case, similarly, in the signal receiving mode, the middle gain RF signal is received and transmitted through the second signal receiving channel that is formed by the capacitor C1', the second inductor L2', the third inductor L3', the bypass coupling circuit 20, and the mixer 162. In addition, when the wireless transceiver device 10 is in the signal transmitting mode, the processor 26 controls the switching element SW1 to be in a conducting state. In this case, the second RF signal is transmitted through the transmitting circuit 22 and the signal transmitting channel that is formed by the third inductor L3, the second inductor L2, and the capacitor C1.

Both the bypass coupling circuit 20 used in the wireless transceiver device 10 shown in FIG. 1 and FIG. 2 and the bypass coupling circuit 20 used in the wireless transceiver device 10 shown in FIG. 3 and FIG. 4 may include different circuit structure designs. Various embodiments of the bypass coupling circuit 20 are further described below with reference to the embodiment shown in FIG. 2.

Figure 5:
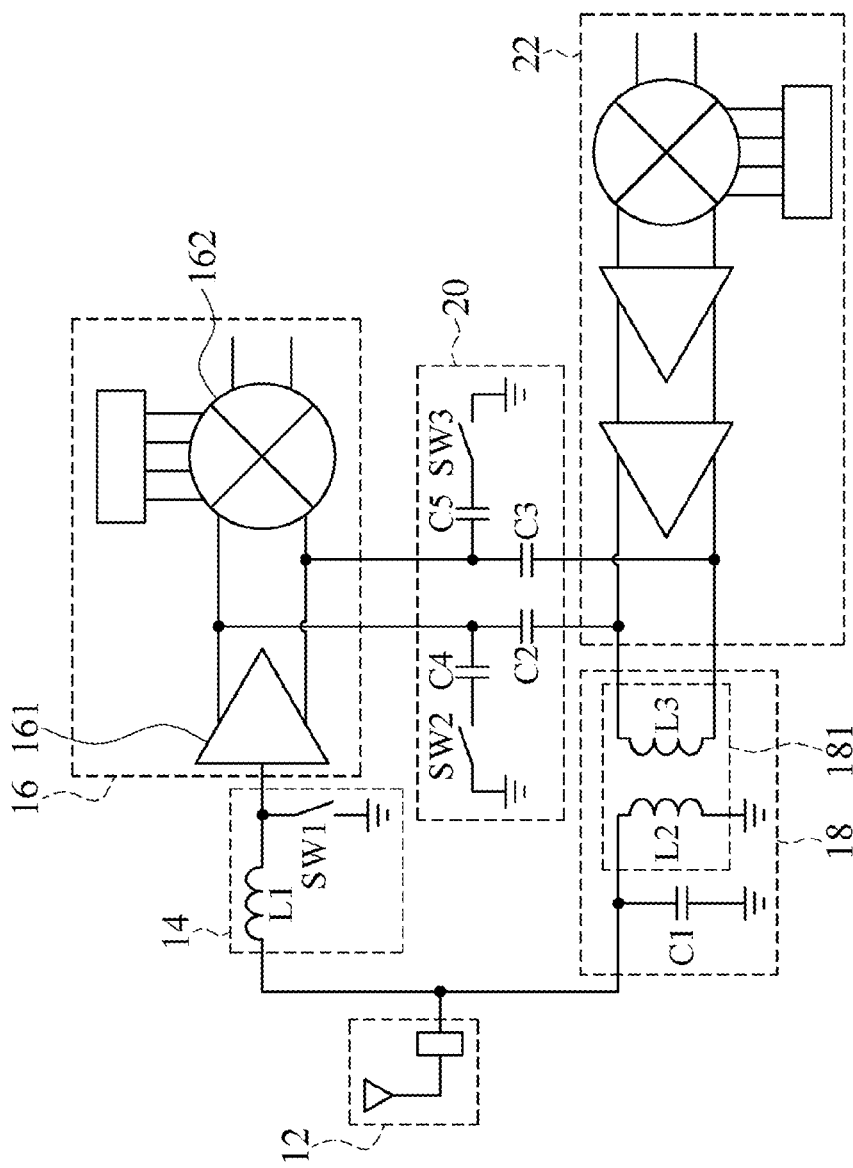
FIG. 5 is schematic circuit diagram of a wireless transceiver device with a capacitive voltage dividing coupling circuit according to an embodiment of the present invention.

In an embodiment, referring to FIG. 5, the bypass coupling circuit 20 is a capacitive voltage dividing coupling circuit. The bypass coupling circuit 20 includes four capacitors C2, C3, C4, and C5 and two switching elements SW2 and SW3. The switching elements SW2 and SW3 are controlled by a processor at a back end and are operated in synchronization with the switching element SW1. When the switching elements SW2 and SW3 are conducting, the bypass coupling circuit 20 is conducting, and the bypass coupling circuit 20, the capacitor C1, the second inductor L2, the third inductor L3, and the mixer 162 form the second signal receiving channel. Therefore, in the signal receiving mode, the middle gain RF signal may be received and transmitted.

Figure 6:
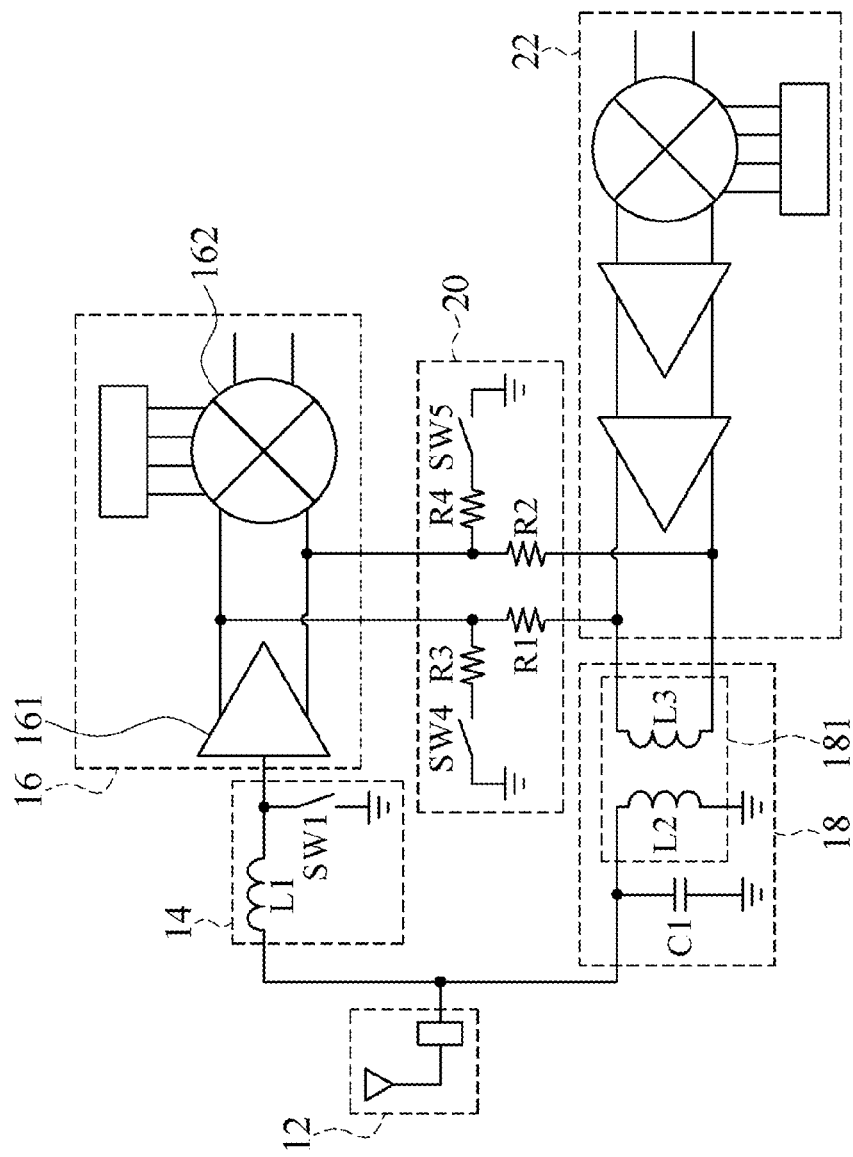
FIG. 6 is schematic circuit diagram of a wireless transceiver device with a resistive voltage dividing coupling circuit according to an embodiment of the present invention.

In an embodiment, referring to FIG. 6, the bypass coupling circuit 20 is a resistive voltage dividing coupling circuit. The bypass coupling circuit 20 includes four resistors R1, R2, R3, and R4 and two switching elements SW4 and SW5. The switching elements SW4 and SW5 are controlled by a processor at a back end and are operated in synchronization with the switching element SW1. When the switching elements SW4 and SW5 are conducting, the bypass coupling circuit 20 is conducting, and the bypass coupling circuit 20, the capacitor C1, the second inductor L2, the third inductor L3, and the mixer 162 form the second signal receiving channel. Therefore, in the signal receiving mode, the middle gain RF signal may be received and transmitted.

Figure 7:
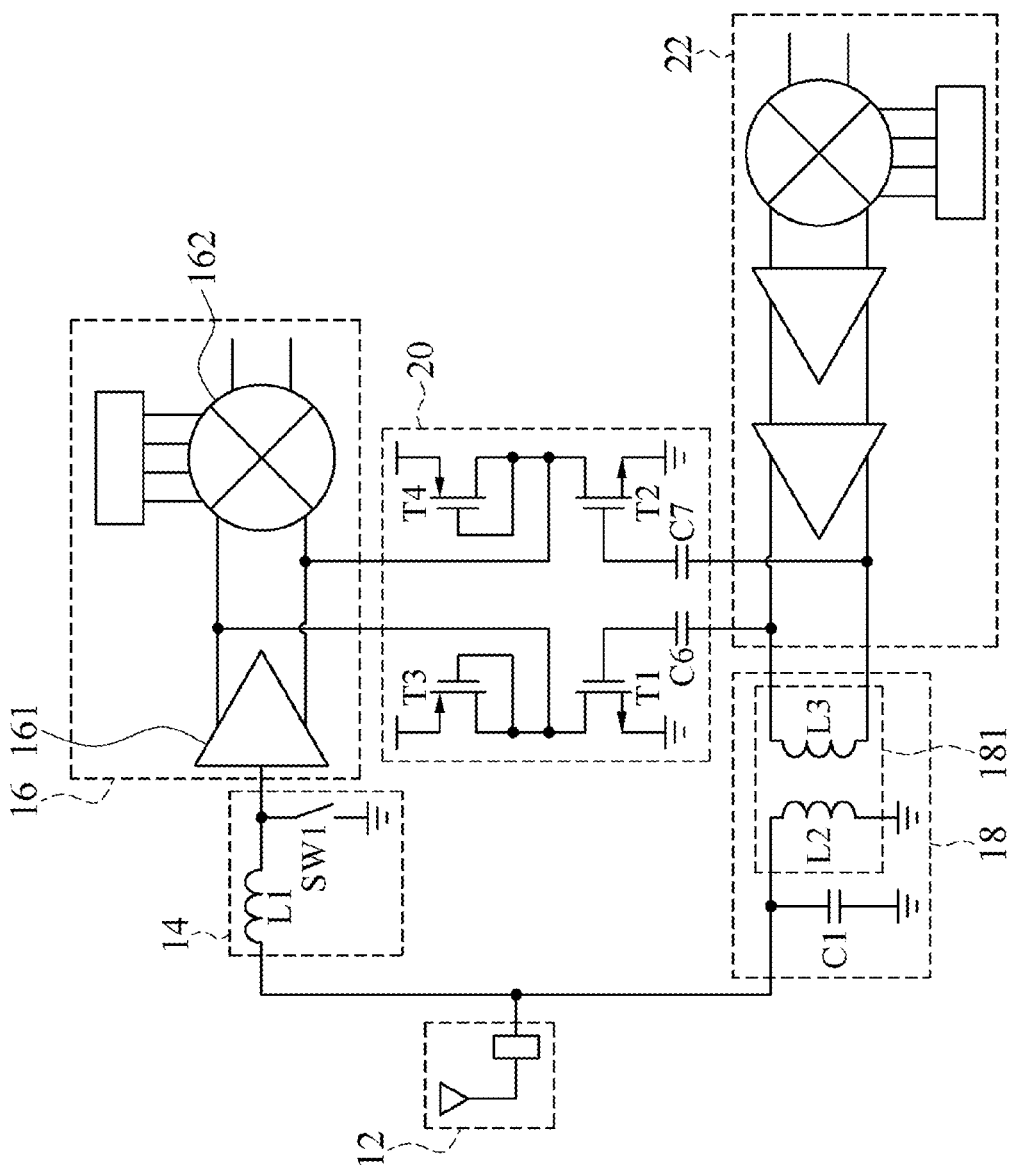
FIG. 7 is schematic circuit diagram of a wireless transceiver device with an active element coupling circuit according to an embodiment of the present invention.

In an embodiment, referring to FIG. 7, the bypass coupling circuit 20 is an active element coupling circuit. The bypass coupling circuit 20 includes two capacitors C6 and C7 and four transistor elements T1, T2, T3, and T4. The transistor elements T1, T2, T3, and T4 are controlled by a processor at a back end and are operated in synchronization with the switching element SW1. When the transistor elements T1, T2, T3, and T4 are conducting, the bypass coupling circuit 20 is conducting, and the bypass coupling circuit 20, the capacitor C1, the second inductor L2, the third inductor L3, and the mixer 162 form the second signal receiving channel. Therefore, in the signal receiving mode, the middle gain RF signal may be received and transmitted.

Certainly, the bypass coupling circuit 20 used in FIG. 5 to FIG. 7 may further be applied to the wireless transceiver device 10 in FIG. 4. Therefore, the bypass coupling circuit 20 may be simply reused with reference to the foregoing embodiments, and is not described herein again.

Therefore, the wireless transceiver device proposed by the present invention may receive the middle gain RF signal through the bypass coupling circuit in the signal receiving mode, so that the bypass coupling circuit may share the matching unit (the second matching unit) on a transmitting path or be configured to use an independent matching unit (the third matching unit). Therefore, when receiving the signal, the wireless transceiver device is not affected by the off-state (non-conducting state) switching element, so that linearity of the receiving circuit can be improved, and a circuit design of the wireless transceiver circuit is more flexible, thereby providing a signal transmitting method with desirable linearity.

Although the present invention has been described in considerable detail with reference to certain preferred embodiments thereof, the invention is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wireless transceiver device, comprising:
   an antenna unit for receiving a first RF (Radio Frequency) signal or transmitting a second RF (Radio Frequency) signal;
   a first matching unit, electrically connected to the antenna unit;
   a receiving circuit, electrically connected to the first matching unit, wherein the first matching unit and the receiving circuit form a first signal receiving channel for receiving the first RF signal when the first RF signal is a high/low gain RF signal;
   a second matching unit, electrically connected to the antenna unit;
   a transmitting circuit, electrically connected to the second matching unit, wherein the second matching unit and the transmitting circuit form a signal transmitting channel for transmitting the second RF signal; and
   a bypass coupling circuit, electrically connected to the receiving circuit and the second matching unit, wherein the second matching unit, the bypass coupling circuit, and the receiving circuit form a second signal receiving channel for receiving the first RF signal when the first RF signal is a middle gain RF signal.

2. The wireless transceiver device according to claim 1, wherein the bypass coupling circuit is a capacitive voltage dividing coupling circuit, a resistive voltage dividing coupling circuit or an active element coupling circuit.

3. A wireless transceiver device, comprising:
   an antenna unit for receiving a first RF signal or transmitting a second RF signal;
   a first matching unit, electrically connected to the antenna unit;
   a receiving circuit, electrically connected to the first matching unit, wherein the first matching unit and the receiving circuit form a first signal receiving channel for receiving the first RF signal when the first RF signal is a high/low gain RF signal;
   a second matching unit, electrically connected to the antenna unit;
   a transmitting circuit, electrically connected to the second matching unit, wherein the second matching unit and the transmitting circuit form a signal transmitting channel for transmitting the second RF signal; and
   a bypass coupling circuit, electrically connected to the receiving circuit and the second matching unit, wherein the second matching unit, the bypass coupling circuit, and the receiving circuit form a second signal receiving channel for receiving the first RF signal when the first RF signal is a middle gain RF signal;
   wherein the receiving circuit further comprises:
   a low noise amplifier (LNA), electrically connected to the first matching unit to receive the high/low gain RF signal matched by the first matching unit and perform signal amplification; and
   a mixer, electrically connected to the LNA, so that the mixer receives the high/low gain RF signal, down-converts the high/low gain RF signal, and transmits the down-converted high/low gain RF signal to a back end for processing, wherein
   the bypass coupling circuit is electrically connected to the mixer, so that the mixer is configured to receive the middle gain RF signal, down-convert the middle gain RF signal, and transmit the down-converted middle gain RF signal to the back end for processing.

4. The wireless transceiver device according to claim 3, wherein the first matching unit further comprises:
   a first inductor, electrically connected to the antenna unit and the LNA; and
   a switching element, wherein one end of the switching element is electrically connected between the first inductor and the LNA, and the other end of the switching element is connected to a ground terminal; when the switching element is in a non-conducting state, the high/low gain RF signal is transmitted through the first signal receiving channel that is formed by the first inductor, the LNA, and the mixer; and when the switching element is in a conducting state, the LNA is in an off state, and the middle gain RF signal is transmitted through the second signal receiving channel that is formed by the second matching unit, the bypass coupling circuit, and the mixer.

5. The wireless transceiver device according to claim 4, wherein the second matching unit further comprises:
   at least one passive element, electrically connected to the antenna unit and the ground terminal; and
   an inductor pair, comprising a second inductor and a third inductor, wherein the second inductor is connected in parallel to the passive element, and the third inductor is electrically connected to the transmitting circuit and the bypass coupling circuit.

6. A wireless transceiver device, comprising:
   an antenna unit for receiving a first RF signal or transmitting a second RF signal;
   a first matching unit, electrically connected to the antenna unit;
   a receiving circuit, electrically connected to the first matching unit, wherein the first matching unit and the receiving circuit form a first signal receiving channel for receiving the first RF signal when the first RF signal is a high/low gain RF signal;
   a second matching unit, electrically connected to the antenna unit;
   a transmitting circuit, electrically connected to the second matching unit, wherein the second matching unit and the transmitting circuit form a signal transmitting channel for transmitting the second RF signal;
   a third matching unit, electrically connected to the antenna unit; and
   a bypass coupling circuit, electrically connected to the third matching unit and the receiving circuit, wherein the third matching unit, the bypass coupling circuit, and the receiving circuit form a second signal receiving channel for receiving the first RF signal when the first RF signal is a middle gain RF signal.

7. The wireless transceiver device according to claim 6, wherein the receiving circuit further comprises:
   a low noise amplifier (LNA), electrically connected to the first matching unit to receive the high/low gain RF signal matched by the first matching unit and perform signal amplification; and
   a mixer, electrically connected to the LNA, so that the mixer receives the high/low gain RF signal, down-converts the high/low gain RF signal, and transmits the down-converted high/low gain RF signal to a back end for processing, wherein
   the bypass coupling circuit is electrically connected to the mixer, so that the mixer is configured to receive the middle gain RF signal, down-convert the middle gain RF signal, and transmit the down-converted middle gain RF signal to the back end for processing.

8. The wireless transceiver device according to claim 7, wherein the first matching unit further comprises:
   a first inductor, electrically connected to the antenna unit and the LNA; and
   a switching element, wherein one end of the switching element is electrically connected between the first inductor and the LNA, and the other end of the switching element is connected to a ground terminal; when the switching element is in a non-conducting state, the high/low gain RF signal is transmitted through the first signal receiving channel that is formed by the first inductor, the LNA, and the mixer; and when the switching element is in a conducting state, the LNA is in an off state, and the middle gain RF signal is transmitted through the second signal receiving channel that is formed by the third matching unit, the bypass coupling circuit, and the mixer.

9. The wireless transceiver device according to claim 8, wherein the second matching unit further comprises:
   at least one passive element, electrically connected to the antenna unit and the ground terminal; and
   an inductor pair, comprising a second inductor and a third inductor, wherein the second inductor is connected in parallel to the passive element, and the third inductor is electrically connected to the transmitting circuit.

10. The wireless transceiver device according to claim 8, wherein the third matching unit further comprises:
    at least one passive element, electrically connected to the antenna unit and the ground terminal; and
    an inductor pair, comprising a second inductor and a third inductor, wherein the second inductor is connected in parallel to the passive element, and the third inductor is electrically connected to the bypass coupling circuit.

11. The wireless transceiver device according to claim 6, wherein the bypass coupling circuit is a capacitive voltage dividing coupling circuit, a resistive voltage dividing coupling circuit or an active element coupling circuit.

* * * * *